US012800474B2

(12) United States Patent
Jones et al.

(10) Patent No.: US 12,800,474 B2
(45) Date of Patent: Nov. 17, 2026

(54) CUSTOMIZED THIN FILM OPTICAL ELEMENT FABRICATION SYSTEM AND METHOD

(71) Applicant: Halliburton Energy Services, Inc., Houston, TX (US)

(72) Inventors: Christopher Michael Jones, Houston, TX (US); Bin Dai, Houston, TX (US); James M. Price, Houston, TX (US); Jian Li, Houston, TX (US); Michael T. Pelletier, Houston, TX (US); Darren Gascooke, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 207 days.

(21) Appl. No.: 18/096,336

(22) Filed: Jan. 12, 2023

(65) Prior Publication Data

US 2023/0146946 A1 May 11, 2023

Related U.S. Application Data

(62) Division of application No. 16/571,287, filed on Sep. 16, 2019, now abandoned.

(51) Int. Cl.
*C23C 14/50* (2006.01)
*C23C 14/04* (2006.01)
(Continued)

(52) U.S. Cl.
CPC ........... *G01N 21/01* (2013.01); *C23C 14/042* (2013.01); *C23C 14/30* (2013.01); *C23C 14/34* (2013.01);
(Continued)

(58) Field of Classification Search
None
See application file for complete search history.

(56) References Cited

U.S. PATENT DOCUMENTS 5,962,080 A 10/1999 Tan et al.
6,612,915 B1 9/2003 Uzoh et al.
(Continued)

FOREIGN PATENT DOCUMENTS

CN 105452523 A * 3/2016 ............. C23C 14/50
EP 1630261 A2 * 3/2006 ........... C23C 14/505
(Continued)

OTHER PUBLICATIONS

Machine Translation of KR-20170036008-A.*
(Continued)

*Primary Examiner* — David P Turocy
(74) *Attorney, Agent, or Firm* — Conley Rose, P.C.; Rodney B. Carroll

(57) ABSTRACT

A system comprising (i) thin film optical element comprising substrate and thin film stack (≥2 film layers; uniform thickness—variation of less than ±5% in any 10 $mm^2$ stack) deposited on substrate's first side; (ii) holder comprising at least one opening; wherein holder has inner side and outer side having beveled edge extending into lip having flat side and beveled edge side; wherein beveled edge/beveled edge side of lip form angle <45° with flat side of lip/first side; wherein flat side of lip and holder inner side define socket receiving substrate; wherein opening exposes first side to deposition plume; wherein first side contacts flat side of lip, thereby allowing film stack deposition on first side; wherein beveled edge side/beveled edge provide film uniformity, and (iii) deposition source providing plume traveling towards first side perpendicular to flat side of lip/first deposition side; and wherein beveled edge side faces plume.

20 Claims, 6 Drawing Sheets

(51) Int. Cl.

| | |
|---|---|
| ***C23C 14/30*** | (2006.01) |
| ***C23C 14/34*** | (2006.01) |
| ***G01N 21/01*** | (2006.01) |
| ***G01N 21/17*** | (2006.01) |
| *E21B 49/08* | (2006.01) |

(52) U.S. Cl.
CPC ............. *C23C 14/50* (2013.01); *G01N 21/17* (2013.01); *E21B 49/08* (2013.01)

(56) References Cited

U.S. PATENT DOCUMENTS

| | | | |
|---|---|---|---|
| 6,716,322 B1 | 4/2004 | Hedge et al. | |
| 6,773,560 B2 | 8/2004 | Pedersen et al. | |
| 7,033,465 B1 | 4/2006 | Patton et al. | |
| 2009/0286342 A1 | 11/2009 | Takahashi et al. | |
| 2016/0146724 A1 | 5/2016 | Gao et al. | |
| 2017/0323815 A1* | 11/2017 | Kuenanz | H01L 21/67346 |

FOREIGN PATENT DOCUMENTS

| | | | |
|---|---|---|---|
| KR | 20170036008 A * | 3/2017 | |
| WO | WO-2016003401 A1 * | 1/2016 | C23C 14/30 |
| WO | WO-2017101971 A1 * | 6/2017 | H01L 21/6776 |

OTHER PUBLICATIONS

Machine Translation of CN-105452523-A.*
Foreign Communication from Related Application—International Search Report and Written Opinion of the International Searching Authority, International Application No. PCT/US2019/052716, dated Jun. 12, 2020, 12 pages.
Office Action dated Jan. 21, 2022 (23 pages), U.S. Appl. No. 16/571,287, filed Sep. 16, 2019.
Final Office Action dated Apr. 14, 2022 (20 pages), U.S. Appl. No. 16/571,287, filed Sep. 16, 2019.
Office Action dated Aug. 17, 2022 (21 pages), U.S. Appl. No. 16/571,287, filed Sep. 16, 2019.
Final Office Action dated Nov. 4, 2022 (22 pages), U.S. Appl. No. 16/571,287, filed Sep. 16, 2019.

* cited by examiner

CUSTOMIZED THIN FILM OPTICAL ELEMENT FABRICATION SYSTEM AND METHOD

CROSS REFERENCE TO RELATED APPLICATIONS

This application is a divisional of and claims priority to U.S. patent application Ser. No. 16/571,287 filed Sep. 16, 2019, published as U.S. Patent Application Publication No. 2021/0080380 A1, and entitled "Customized Thin Film Optical Element Fabrication System and Method," which is incorporated herein by reference in its entirety.

BACKGROUND

This disclosure relates to methods of making thin film optical elements. More specifically, it relates to methods of fabricating customized thin film optical elements that do not require a size adjustment prior to employing in an opticoanalytical device.

Optical computing devices, also commonly referred to as opticoanalytical devices, can be used to analyze and monitor a sample substance in real time. Optical computing devices may employ optical processing elements, such as integrated computational elements (ICEs), which may also be referred to as ICE cores. An ICE can be an optical substrate with multiple stacked dielectric layers (e.g., from about 2 to about 50 layers), each layer having a different complex refractive index from its adjacent layers. The specific number of layers, N, the optical properties (e.g. real and imaginary components of complex indices of refraction) of the layers, the optical properties of the substrate, and the physical thickness of each of the layers that compose the ICE can be selected so that the light processed by the ICE is related to one or more characteristics of the sample. Because ICEs extract information from the light modified by a sample passively, ICEs can be incorporated in low cost and rugged optical analysis tools. Hence, ICE-based downhole optical analysis tools can provide a relatively low cost, rugged and accurate system for monitoring quality of wellbore fluids, for instance.

However, errors in fabrication of the constituent layers of an ICE can negatively impact the performance of the ICE. In most cases, fairly small deviations (e.g., <0.1%) from point by point design values of complex indices of refraction, and/or thicknesses of the formed layers of the ICE can substantially impact the ICE's performance, in some cases to such an extent, that the ICE becomes operationally useless. Ultra-high accuracies required by ICE designs challenge the state of the art in thin film deposition techniques.

Generally, thin film fabrication techniques for optics are applied to bulk systems, wherein a large number of identical optical elements are fabricated on the same large substrate and are subsequently sized (e.g., cored) into smaller optical elements of desirable shapes. The elements are usually fabricated on large substrates in thin film deposition systems, which may either employ physical vapor deposition techniques or chemical vapor deposition techniques. Unique challenges occur when trying to fabricate a small number of customized thin film optical elements. For physical vapor deposition methods (e.g., ion-assisted E-beam deposition), challenges include the difficulty associated with fixating the substrates with respect to the deposition plume. Securing the substrates typically involves resting the substrate on a beveled lip machined out of a platter and held in place by gravity. Other options to secure the substrates (including vacuum, magnetic, electrostatic, and mechanical/compression) are not viable due to the pre-requisites of the environment within the deposition chamber. These challenges are exacerbated when trying to fabricate small elements on substrates of less than about 0.5 inches, wherein quality control becomes difficult and must be applied to each element. Thus, an ongoing need exists for fabricating multilayer thin optical elements that do not require a size adjustment subsequent to depositing the multi-layers on a substrate.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts.

DETAILED DESCRIPTION

Figure 1:
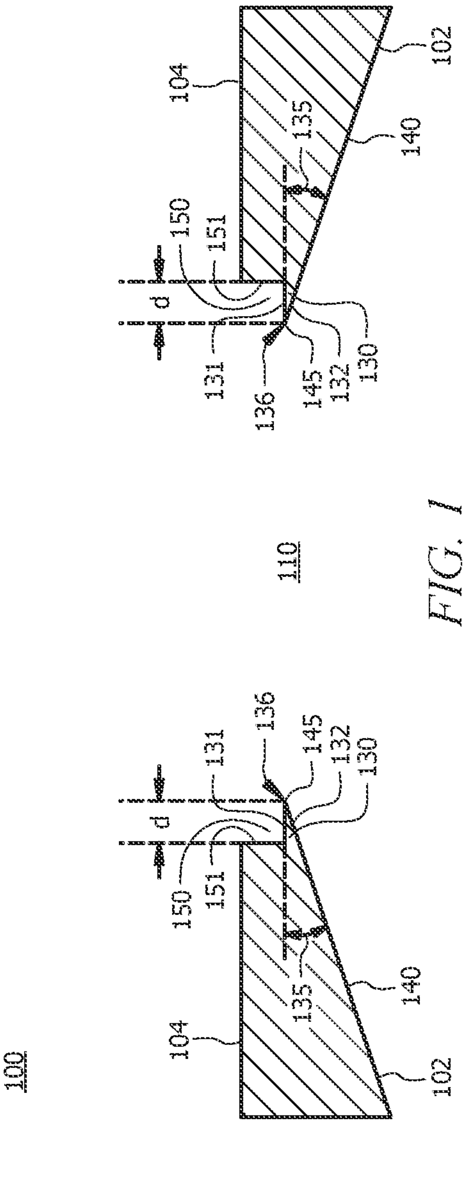
FIG. 1 displays a schematic of a substrate holder.

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques below, including the exemplary designs and implementations illustrated and described herein, but may be modified within the scope of the appended claims along with their full scope of equivalents.

In the drawings and description that follow, like parts are typically marked throughout the specification and drawings with the same reference numerals, respectively. In addition, similar reference numerals may refer to similar components in different embodiments disclosed herein. The drawing figures are not necessarily to scale. Certain features of the disclosed embodiments may be shown exaggerated in scale or in somewhat schematic form and some details of conventional elements may not be shown in the interest of clarity and conciseness. The present disclosure is susceptible to embodiments of different forms. Specific embodiments are described in detail and are shown in the drawings, with the understanding that the present disclosure is not intended to be limited to the embodiments illustrated and described herein. It is to be fully recognized that the different teachings of the embodiments discussed herein may be employed separately or in any suitable combination to produce desired results.

Disclosed herein are systems for making thin film optical elements. In an embodiment, a system for making a thin film optical element can comprise (i) a thin film optical element comprising a substrate and a first thin film stack, wherein the first thin film stack is deposited on a first deposition side of the substrate; wherein the first thin film stack comprises two or more film layers; wherein the first thin film stack is characterized by a first uniform film thickness; and wherein the first uniform film thickness is defined as a thickness variation of less than about ±5% in any 10 $mm^2$ of the first thin film stack, when compared to an average first thin film stack thickness across the entire first thin film stack; (ii) a holder comprising at least one holder opening; wherein the holder has a holder outer side and a holder inner side, wherein the holder outer side has at least one beveled edge extending into a lip; wherein the beveled edge and the lip define the at least one holder opening; wherein the lip has a substantially flat side and a beveled edge side; wherein the beveled edge and/or the beveled edge side of the lip form an angle of less than about 45° with the substantially flat side of the lip and/or the first deposition side, wherein the substantially flat side of the lip and the holder inner side define a holder socket; wherein the holder is configured to receive the substrate in the holder socket; wherein the holder opening is configured to expose the first deposition side of the substrate to a deposition plume; wherein a portion of the first deposition side of the substrate contacts the substantially flat side of the lip, thereby allowing for the first thin film stack to be deposited on the first deposition side of the substrate; and wherein the beveled edge side of the lip and/or the beveled edge provide for the first uniform film thickness of the first thin film stack; and (iii) a deposition source configured to provide the deposition plume for depositing the first thin film stack on the first deposition side of the substrate; wherein the deposition plume travels towards the first deposition side of the substrate at a direction substantially perpendicular to the substantially flat side of the lip and/or to the first deposition side of the substrate; and wherein the beveled edge side of the lip faces the deposition plume.

Further disclosed herein are methods of making thin film optical elements. In an embodiment, a method of making a thin film optical element can comprise (a) placing a substrate in a holder socket of a holder as disclosed herein; and (b) depositing, with a deposition plume, a first thin film stack on a first deposition side of the substrate to form a thin film optical element, wherein the thin film optical element comprises the substrate and the first thin film stack deposited on the first deposition side of the substrate; wherein the first thin film stack comprises two or more film layers; wherein the first thin film stack is characterized by a first uniform film thickness; and wherein the first uniform film thickness is defined as a thickness variation of less than about ±5% in any 10 $mm^2$ of the first thin film stack, when compared to an average first thin film stack thickness across the entire first thin film stack. In such embodiment, the method of making a thin film optical element can further exclude modifying the size of the thin film optical element. For example, the substrate can be sized to a target size prior to depositing the first thin film stack on the substrate.

Figure 2:
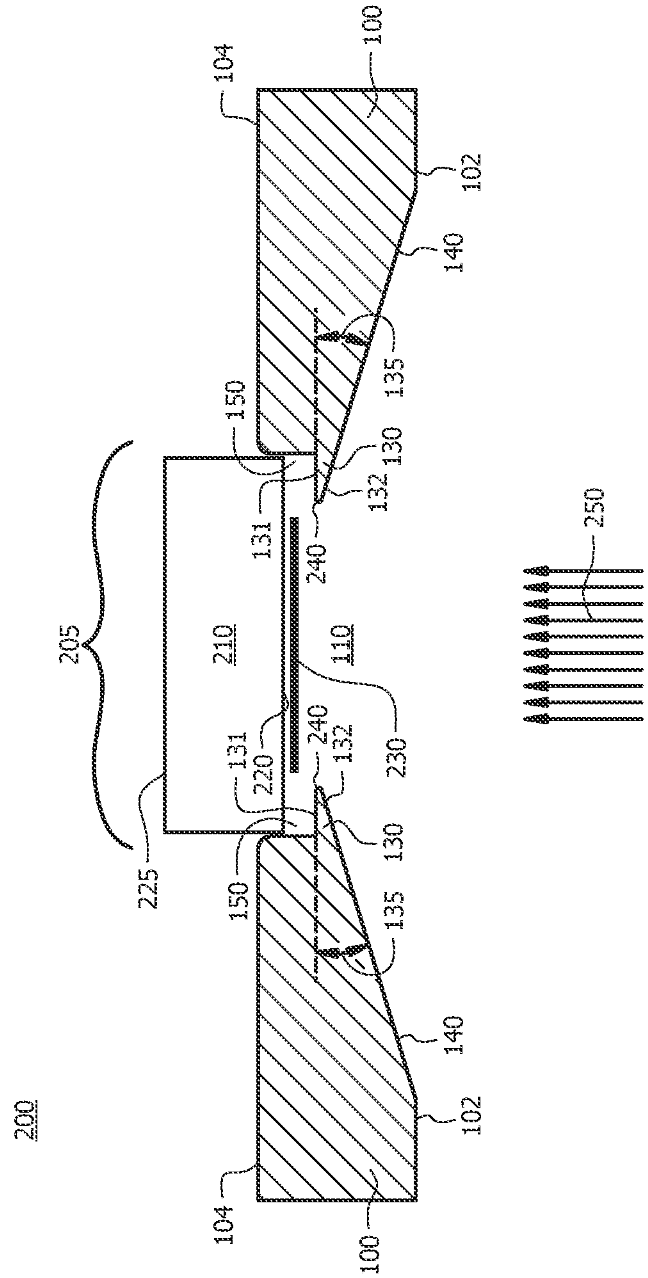
FIG. 2 displays a schematic of a system for making a thin film optical element.
Figure 3:
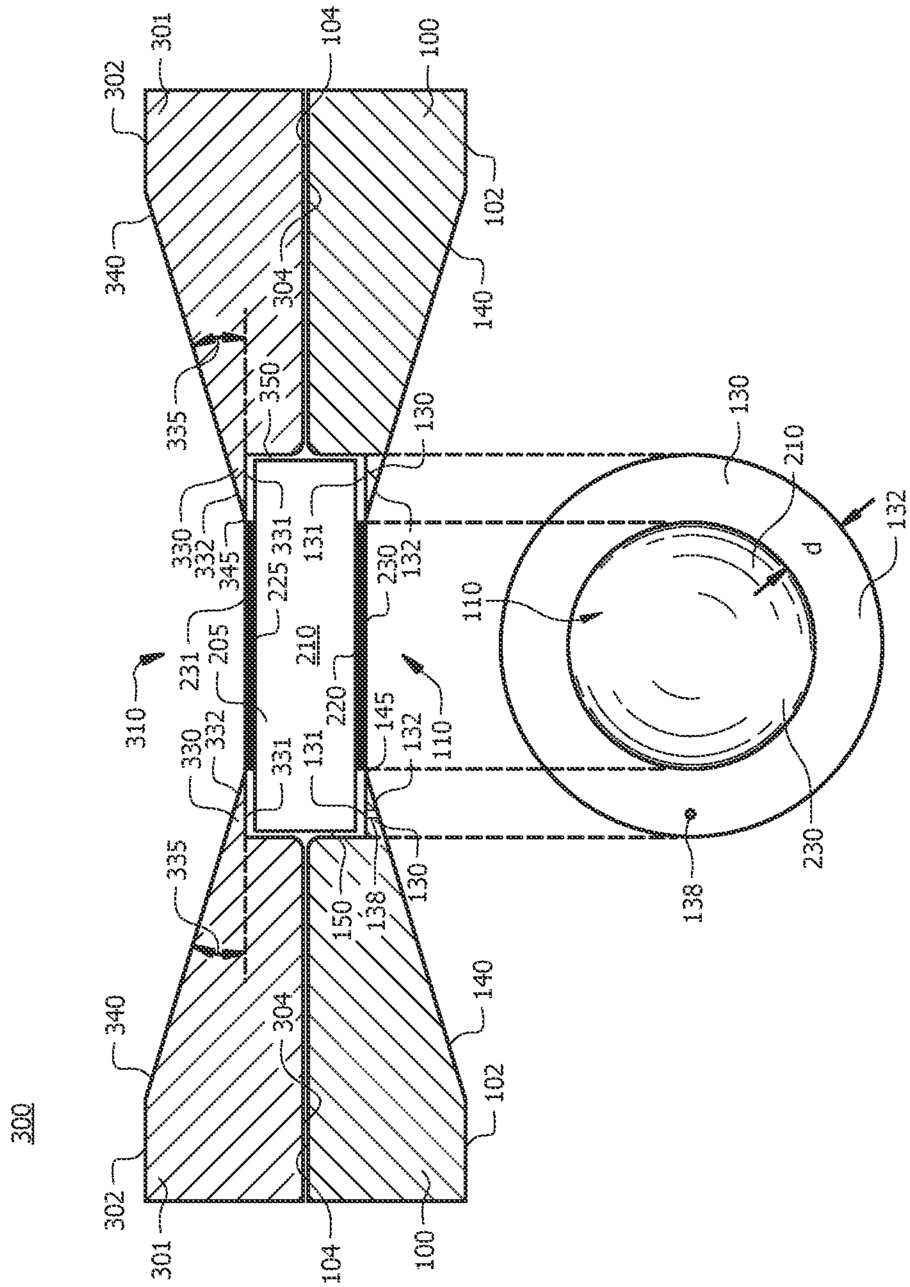
FIG. 3 displays a schematic of another system for making a thin film optical element.
Figure 4:
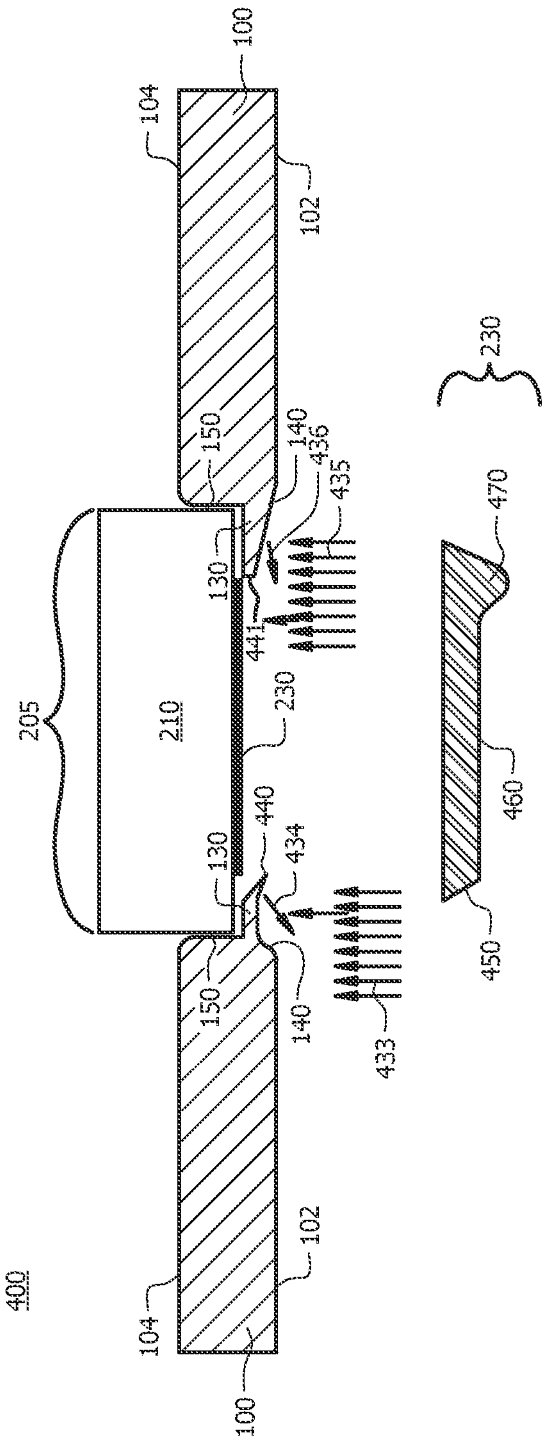
FIG. 4 displays a schematic of yet another system for making a thin film optical element.
Figure 5A:
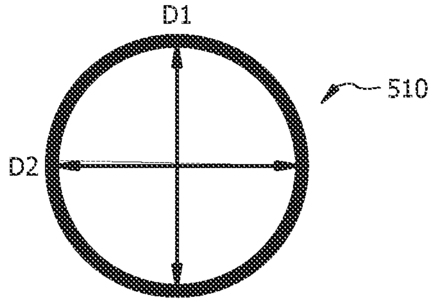
FIGS. 5A, 5B, and 5C display schematics of different substrate geometries.
Figure 5B:
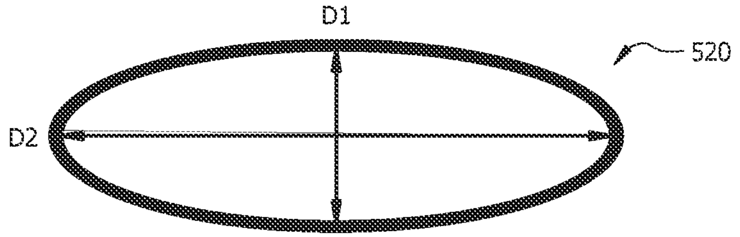
Figure 5C:
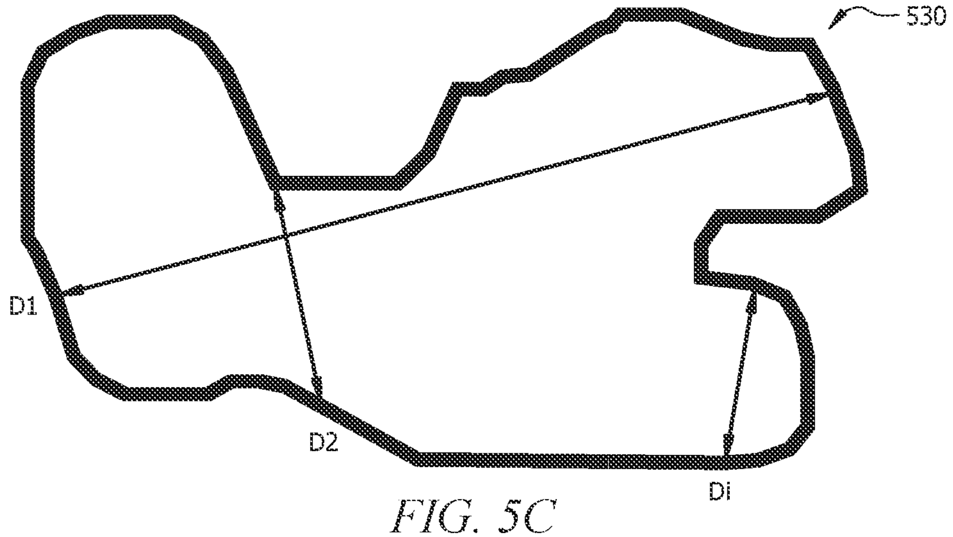
Figure 6:
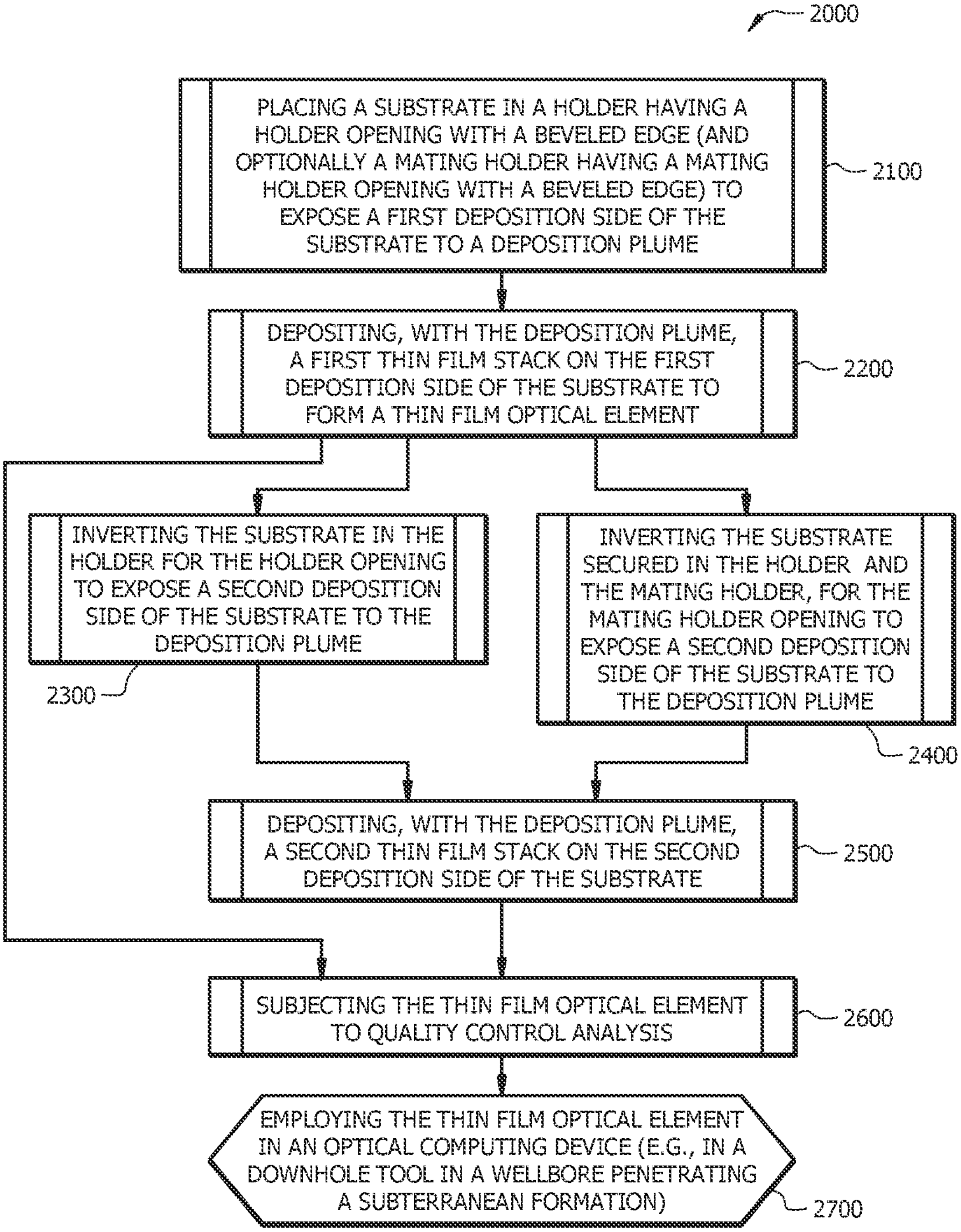
FIG. 6 illustrates a flow diagram of a method for making a thin film optical element.

In some embodiments, for example as depicted in FIGS. 1-4, a holder 100 as disclosed herein can comprise at least one holder opening 110. FIG. 1 displays a schematic of a holder 100. FIGS. 2, 3, and 4 display schematics of systems 200, 300, and 400, respectively for making a thin film optical element 205. FIGS. 5A, 5B, and 5C display schematics of different geometries for substrate 100. Referring to FIG. 6, a method 2000 of making a thin film optical element is illustrated.

In an embodiment, a method 2000 of making a thin film optical element as disclosed herein can comprise placing 2100 a substrate 210 in a holder socket 150 of a holder 100.

In some embodiments, the holder 100 may comprise a plurality of holder openings 110. The holder 100 may comprise from about 1 to about 100, alternatively from about 2 to about 75, or alternatively from about 5 to about 75 holder openings 110, wherein each holder opening 110 is configured to receive a single substrate 210. The number of holder openings 110 in the holder 100 dictates the number of substrates 210 that can be used for making thin film optical elements concurrently. For example, when a holder 100 has 15 holder openings 110, the holder 100 can receive at least 1 and up to and including 15 substrates 210 for making at least 1 and up to and including 15 thin film optical elements concurrently; although any suitable number of substrates 210 equal to or less than 15 can be used in this case for making equal to or less than 15 thin film optical elements concurrently.

In an embodiment, the holder 100 comprises a plurality of holder openings 110; wherein the plurality of holder openings 110 provides for the deposition of a thin film stack on a plurality of substrates 210; and wherein each holder opening 110 is configured to allow for the deposition of a thin film stack on an individual substrate 210.

The holder opening 110 can have any suitable geometry. For example, the holder opening 110 can be circular. As another example, the holder opening 110 can be elliptical. As yet another example, the holder opening 110 can be characterized by irregular geometry. In some embodiments, all holder openings 110 of the same holder 100 can have the same geometry (e.g., all holder openings 110 of the same holder 100 can be circular; all holder openings 110 of the same holder 100 can be elliptical; all holder openings 110 of the same holder 100 can be characterized by irregular geometry, etc.). In other embodiments, the holder openings 110 of the same holder 100 can have dissimilar geometry. For example, a portion of the holder openings 110 of the holder 100 can be circular, while another portion of the holder openings 110 of the same holder 100 can be elliptical, and while yet while another portion of the holder openings 110 of the same holder 100 can be characterized by irregular geometry; thereby allowing for substrates 210 of varying geometries to be formed into thin film optical elements concurrently.

In some embodiments, for example as depicted in FIG. 1, a holder 100 as disclosed herein can have a holder outer side 102 and a holder inner side 104; wherein the holder outer side 102 has at least one beveled edge 140 extending into a lip 130; and wherein the beveled edge 140 and the lip 130 define the at least one holder opening 110. As will be appreciated by one of skill in the art, and with the help of this disclosure, each holder opening 110 of the holder 100 is individually defined by a beveled edge 140 and by a lip 130. In other words, the holder 100 has, on the holder outer side 102, an individual beveled edge 140 extending into a lip 130 for each individual holder opening 110.

The lip 130 can have a substantially flat side 131 and a beveled edge side 132. The substantially flat side 131 of the lip 130 faces about the same direction as the holder inner side 104. The beveled edge side 132 faces about the same direction as the beveled edge 140. In an embodiment, the beveled edge 140 and/or the beveled edge side 132 form an angle 135 of less than about 45°, alternatively less than about 40°, alternatively less than about 35°, alternatively less than about 30°, alternatively less than about 25°, alternatively less than about 20°, or alternatively less than about 15° with the substantially flat side 131 of the lip 130.

The lip 130 is characterized by a terminal edge 136 that further defines the holder opening 110. In some embodiments, the terminal edge 136 can be a sharp terminal edge 145, for example as depicted in FIGS. 1 and 3. In other embodiments, the terminal edge 136 can be a blunted terminal edge 240, for example as depicted in FIG. 2. The blunted terminal edge may be provided for safety and/or convenience. In yet other embodiments, the terminal edge 136 can be a deflecting terminal edge 440, for example as depicted in FIG. 4. The shape of the terminal edge 136 can influence the uniformity of the film or film stack deposited on the substrate 210, as will be described in more detail later herein.

In some embodiments, all terminal edges 136 within the same holder 100 can have the same geometry (e.g., all terminal edges 136 within the same holder 100 can be sharp; all terminal edges 136 within the same holder 100 can be blunted; all terminal edges 136 within the same holder 100 can be deflecting; etc.). In other embodiments, the terminal edges 136 within the same holder 100 can have dissimilar geometry. For example, a portion of the terminal edges 136 within the holder 100 can be sharp, while another portion of the terminal edges 136 within the same holder 100 can be blunted, and while yet while another portion of the terminal edges 136 within the same holder 100 can be deflecting; thereby allowing for tuning the deposition of the film and/or film stack on the substrate 210.

The substantially flat side 131 of the lip 130 and the holder inner side 104 define a holder socket 150, for example as depicted in FIGS. 1-4, wherein the holder 100 is configured to receive the substrate 210 in the holder socket 150. As will be appreciated by one of skill in the art, and with the help of this disclosure, each holder 100 has the same number of holder openings 110 and holder sockets 150, wherein each holder opening 110 has a corresponding holder socket 150 that receives each substrate 210. For example, when a holder 100 has 21 holder openings 110, the same holder 100 also has 21 holder sockets 150 that are available to receive up to and including 21 individual substrates 210 for making up to and including 21 thin film optical elements concurrently.

In some embodiments, the substantially flat side 131 of the lip 130 can be characterized by a dimension (d) of less than about 10 mm, alternatively less than about 5 mm, alternatively less than about 5 mm, alternatively less than about 4 mm, alternatively less than about 3 mm, alternatively less than about 2 mm, alternatively less than about 1 mm, alternatively less than about 0.9 mm, alternatively less than about 0.8 mm, alternatively less than about 0.7 mm, alternatively less than about 0.6 mm, or alternatively less than about 0.5 mm. For purposes of the disclosure herein, the dimension (d) of the substantially flat side 131 of the lip 130 refers to the shortest distance between the terminal edge 136 and an inner wall 151 of the holder socket 150.

In some embodiments, the lip 130 can further comprise one or more locating holes 138, for example as depicted in FIG. 3. The lip 130 can comprise any suitable distinctive marking device (e.g., locating hole 138, a marking pin, etc.) that can mark the substrate 210 on its margin. For example, marking the substrate can enable visually identifying a coated side of the substrate (e.g., to prevent depositing a film or film stack on the top of another film stack, as opposed to depositing a film or film stack on the other side of the substrate).

The holder 100 can be made from any suitable material, for example steel, stainless steel, etc.

In some embodiments, for example as depicted in FIGS. 2-4, the holder 100 can receive the substrate 210 in the holder socket 150. The substrate 210 can have a first deposition side 220, wherein the holder opening 110 is configured to expose the first deposition side 220 of the substrate 210 to a deposition plume 250, 433, 435; wherein a portion of the first deposition side 220 of the substrate 210 contacts (e.g., rests on) the substantially flat side 131 of the lip 130, thereby allowing for a first thin film stack 230 to be deposited by the deposition plume 250, 433, 435 on the first deposition side 220 of the substrate 210. The substrate 210 can have a second deposition side 225 spatially opposed to the first deposition side 220.

In an embodiment, the substrate 210 comprises an optically transparent material. Generally, a transparent or optically transparent material allows light to pass through the material without being scattered. Typically, transparency can be assessed visually, or by optical microscopy. Nonlimiting examples of optically transparent materials suitable for use in the present disclosure in the substrate 210 include glass, optically transparent glass, silica, sapphire, silicon, germanium, zinc selenide, zinc sulfide, polycarbonate, polymethylmethacrylate (PMMA), polyvinylchloride (PVC), diamond, ceramics, and the like, or combinations thereof. Further, and as will be appreciated by one of skill in the art, and with the help of this disclosure, the material that the substrate is made of can withstand film deposition conditions, such as elevated temperatures, vacuum, etc.

The substrate 210 can have any suitable geometry. Generally, the geometry of the substrate 110 (i.e., holder socket 150) matches the geometry of the substrate 210. In an embodiment, the substrate 210 can be sized to a desired shape and size (e.g., target shape and/or target size) prior to placing the substrate 210 in the holder socket 150 of the holder 100 (i.e., prior to depositing a film or film stack on the substrate 210). The substrate 210 can be sized to a desired shape and size by using any suitable methodology such as coring, cutting, cleaving, grinding, polishing, and the like, or combinations thereof.

In some embodiments, the first deposition side 220 and the second deposition side 225 of the substrate 210 are substantially parallel to each other. For example, the substrate 210 can be a cylinder (e.g., circular cylinder, elliptical cylinder, circular disc, elliptical disc, etc.). In such embodiments, the first deposition side 220 and the second deposition side 225 can be the same (e.g., can have the same size and shape).

In other embodiments, the first deposition side 220 and the second deposition side 225 of the substrate 210 are not parallel to each other. In such embodiments, the first deposition side 220 and the second deposition side 225 can be different (e.g., can have different size and/or shape).

The size of the first deposition side 220 and/or the second deposition side 225 of the substrate 210 can be less than about 0.5 inches (12.7 mm), alternatively less than about 0.25 inches (6.4 mm), or alternatively less than about 0.1 inches (2.5 mm). For purposes of the disclosure herein, the size of the first deposition side 220 and/or the second deposition side 225 of the substrate 210 refers to the longest dimension of the first deposition side 220 and/or the second deposition side 225, respectively. For example, when the first deposition side 220 and/or the second deposition side 225 are circular, the size of the first deposition side 220 and/or the second deposition side 225 refers to the diameter of the first deposition side 220 and/or the second deposition side 225, respectively. As another example, when the first deposition side 220 and/or the second deposition side 225 are elliptical, the size of the first deposition side 220 and/or the second deposition side 225 refers to the diameter along the major axis (e.g., the length of the major axis) of the first deposition side 220 and/or the second deposition side 225, respectively.

In some embodiments, the first deposition side 220 and/or the second deposition side 225 of the substrate 210 can be substantially flat or planar. In such embodiments, the first deposition side 220 and/or the second deposition side 225 of the substrate 210 can be substantially parallel to the substantially flat side 131 of the lip 130. When a mating holder 301 is employed, as will be described in more detail later herein, the first deposition side 220 and/or the second deposition side 225 of the substrate 210 can be substantially parallel to a substantially flat side 331 of a lip 330 of the mating holder 301.

In other embodiments, the first deposition side 220 and/or the second deposition side 225 of the substrate 210 can be rugged (as opposed to flat).

In some embodiments, the first deposition side 220 and/or the second deposition side 225 can be circular 510, for example as depicted in FIG. 5A. The cross-section of the substrate depicted in FIG. 5A indicates that the diameter (D) is regular (D1=D2).

In other embodiments, the first deposition side 220 and/or the second deposition side 225 can be elliptical 520, for example as depicted in FIG. 5B. The cross-section of the substrate depicted in FIG. 5B indicates that the diameter (D) varies across the cross-section (D1≠D2).

In yet other embodiments, the first deposition side 220 and/or the second deposition side 225 can be characterized by irregular geometry 530, for example as depicted in FIG. 5C. The cross-section of the substrate depicted in FIG. 5C indicates that the diameter (D) varies across the cross-section (D1≠D2≠Di≠D1).

In some embodiments, a distance between the first deposition side 220 and the second deposition side 225 of the substrate 210 can be less than the size of the first deposition side 220 and/or the size of the second deposition side 225. For example, in the case of a circular cylindrical substrate, the height of the cylinder is less than the diameter of the cross-section of the cylinder; wherein the substrate 210 is a disc.

In other embodiments, a distance between the first deposition side 220 and the second deposition side 225 of the substrate 210 can be equal to or greater than the size of the first deposition side 220 and/or the size of the second deposition side 225. For example, in the case of a circular cylindrical substrate, the height of the cylinder is equal to or greater than the diameter of the cross-section of the cylinder.

In some embodiments, for example as depicted in FIG. 3, a mating holder 301 can be placed on the substrate 210 and holder 100, wherein the mating holder 301 contacts the substrate 210 and the holder 100.

The mating holder 301 can help secure the substrate 100 in place for film deposition. For example, the mating holder 301 can provide for securing the substrate 210 in place for the deposition of a first thin film stack 230 on the first deposition side 220 of the substrate 210, the deposition of the second thin film stack 231 on the second deposition side 225 of the substrate 210, or both the deposition of the first thin film stack 230 on the first deposition side 220 of the substrate 210 and the deposition of the second thin film stack 231 on the second deposition side 225 of the substrate 210.

Further, the mating holder 301 can provide for spatially rotating (e.g., flipping, inverting, etc.) the substrate 210 such that the desired deposition side faces the deposition plume. For example, the holder 100 and the mating holder 301 can be configured to spatially rotate the secured substrate 210 to provide for the deposition plume 250, 433, 435 traveling towards the first deposition side 220 or the second deposition side 225 of the substrate 210 (as desired) at a direction substantially perpendicular to the first deposition side 220 or the second deposition side 225, respectively.

In some embodiments, the holder 100 and the mating holder 301 can be the same (e.g., can have the same size and shape). In other embodiments, the holder 100 and the mating holder 301 can be different (e.g., can have different size and/or shape).

The mating holder 301 comprises at least one mating holder opening 310. In some embodiments, the mating holder 301 may comprise a plurality of mating holder opening 310. The mating holder 301 may comprise from about 1 to about 100, alternatively from about 2 to about 75, or alternatively from about 5 to about 75 mating holder opening 310, wherein each mating holder opening 310 is configured to receive a single substrate 210. The number of mating holder openings 310 in the mating holder 301 matches the number of holder openings 110 in the holder 100.

In an embodiment, the mating holder 301 comprises a plurality of mating holder openings 310; wherein the plurality of mating holder openings 310 provides for the deposition of a thin film stack on a plurality of substrates 210; and wherein each mating holder opening 310 is configured to allow for the deposition of a thin film stack on an individual substrate 210.

The mating holder 301 has a mating holder outer side 302 and a mating holder inner side 304; wherein the mating holder inner side 304 contacts the holder inner side 104; wherein the mating holder outer side 302 has at least one beveled edge 340 extending into a lip 330; wherein the beveled edge 340 and the lip 330 define the at least one mating holder opening 310; wherein the lip 330 has a substantially flat side 331 and a beveled edge side 332; wherein the beveled edge 340 and/or the beveled edge side 332 form an angle 335 of less than about 45°, alternatively less than about 40°, alternatively less than about 35°, alternatively less than about 30°, alternatively less than about 25°, alternatively less than about 20°, or alternatively less than about 15° with the substantially flat side 331 of the lip 330 and/or the second deposition side 225.

The lip 330 is characterized by a terminal edge that further defines the mating holder opening 310. In some embodiments, the terminal edge of the lip 330 can be a sharp terminal edge 345, for example as depicted in FIG. 3. In other embodiments, the terminal edge of the lip 330 can be a blunted terminal edge. In yet other embodiments, the terminal edge of the lip 330 can be a deflecting terminal edge. The shape of the terminal edge of the lip 330 can influence the uniformity of the film or film stack deposited on the substrate 210, as will be described in more detail later herein.

In some embodiments, all terminal edges within the same mating holder 301 can have the same geometry (e.g., all terminal edges within the same mating holder 301 can be sharp; all terminal edges within the same mating holder 301 can be blunted; all terminal edges within the same mating holder 301 can be deflecting; etc.). In other embodiments, the terminal edges within the same mating holder 301 can have dissimilar geometry. For example, a portion of the terminal edges within the mating holder 301 can be sharp, while another portion of the terminal edges within the same mating holder 301 can be blunted, and while yet while another portion of the terminal edges within the same mating holder 301 can be deflecting; thereby allowing for tuning the deposition of the film and/or film stack on the substrate 210.

The substantially flat side 331 of the lip 330 and the mating holder inner side 304 define a mating holder socket 350; wherein the mating holder 301 is configured to receive the substrate 210 in the mating holder socket 350; wherein the mating holder opening 310 is configured to expose the second deposition side 225 of the substrate 210 to the deposition plume 250, 433, 435; and wherein a portion of the second deposition side 225 of the substrate 210 contacts the substantially flat side 331 of the lip 330, thereby allowing for the second thin film stack 231 to be deposited on the second deposition side 225 of the substrate 210.

As will be appreciated by one of skill in the art, and with the help of this disclosure, when a mating holder is not present or used, the substrate 210 can be secured by any suitable method in the holder 100 (e.g., the substrate 210 can be clamped in the holder 100).

In an embodiment, a method 2000 of making a thin film optical element as disclosed herein can comprise depositing 2200, with a deposition plume 250, 433, 435, a first thin film stack 230 on the first deposition side 220 of the substrate 210 to form a thin film optical element 205, wherein the thin film optical element 205 comprises the substrate 210 and the first thin film stack 230 deposited on the first deposition side 220 of the substrate 210. In such embodiment, the holder opening 110 exposes the first deposition side 220 of the substrate 210 to the deposition plume 250, 433, 435.

The deposition plume 250, 433, 435 can travel towards the first deposition side 220 of the substrate 210 at a direction substantially perpendicular to the substantially flat side 131 of the lip 130 and/or to the first deposition side 220; wherein the beveled edge side 132 of the lip 130 faces the deposition plume 250, 433, 435; and wherein the holder opening 110 exposes the first deposition side 220 to the deposition plume 250, 433, 435.

In some embodiments, the method 2000 of making a thin film optical element as disclosed herein can further comprise inverting 2300 the substrate 210 in the holder socket 150 subsequent to depositing 2200 the first thin film stack 230; wherein the holder opening 110 exposes the second deposition side 225 of the substrate 210 to the deposition plume 250, 433, 435 as disclosed herein.

The deposition plume 250, 433, 435 can travel towards the second deposition side 225 of the substrate 210 at a direction substantially perpendicular to the substantially flat side 131 of the lip 130 and/or to the first deposition side 220; wherein the beveled edge side 132 of the lip 130 faces the deposition plume 250, 433, 435; and wherein the holder opening 110 exposes the second deposition side 225 to the deposition plume 250, 433, 435.

In other embodiments, the method 2000 of making a thin film optical element as disclosed herein can further comprise inverting 2400 the substrate 210 secured in the holder 100 and the mating holder 301 subsequent to depositing 2200 the first thin film stack 230; wherein the mating holder opening 310 exposes the second deposition side 225 of the substrate 210 to the deposition plume 250, 433, 435 as disclosed herein.

The deposition plume 250, 433, 435 can travel towards the second deposition side 225 of the substrate 210 at a direction substantially perpendicular to the substantially flat side 331 of the lip 330 and/or to the second deposition side 225; wherein the beveled edge side 332 of the lip 330 faces the deposition plume 250, 433, 435; and wherein the holder opening 310 exposes the second deposition side 225 to the deposition plume 250, 433, 435.

Generally, the substrate 210, holder 100, and optionally mating holder 301, as well as a deposition source (and consequently the deposition plume 250, 433, 435) are located inside a deposition chamber. In an embodiment, the thin film stacks 230, 231 can be deposited on the substrate by using any suitable methodology, such as any suitable physical vapor deposition (PVD) or chemical vapor deposition (CVD) technique. In the case of CVD techniques, the material to be deposited reacts with a gaseous environment of co-depositing material to form a film of a new material that results from a chemical reaction (e.g., a nitride, an oxide, a carbide, a carbonitride, etc.). Nonlimiting examples of CVD techniques include atmospheric pressure CVD, metal-organic CVD, low pressure CVD, laser CVD, photo-CVD, chemical vapor infiltration, chemical beam epitaxy, plasma-assisted CVD, plasma-enhanced CVD, and the like, or combinations thereof.

Generally, PVD refers to a collection of vaporization coating techniques in which a material is atomically transferred from solid phase (e.g., deposition source) to vapor phase (e.g., vapor of material to be deposited forming the deposition plume 250, 433, 435) and back to the solid phase (e.g., thin film), gradually building a film on the surface to be coated (e.g., first deposition side 220, second deposition side 225).

In PVD, the layers of the thin film stacks 230, 231 are formed by condensation of vaporized material from the deposition source, while maintaining a vacuum in the deposition chamber. An example of a PVD technique is electron beam (E-beam) deposition, in which a beam of high energy electrons (i.e., electron beam) is electromagnetically focused onto the material(s) of the deposition source(s), to evaporate atomic species. In some embodiments, E-beam deposition can be assisted by ions, provided by ion-sources, to clean or etch the substrate 210; and/or to increase the energy of the evaporated material(s), such that the evaporated material(s) is deposited onto the substrate 210 more densely, for example. Other nonlimiting examples of PVD techniques that can be used to form the thin film stacks 230, 231 include cathodic arc deposition (in which an electric arc discharged at the material(s) of the deposition source(s) blasts away some material(s) into ionized vapor to be deposited onto the substrate 210); evaporative deposition (in which material(s) included of the deposition source(s) is heated to a high vapor pressure by electrically resistive heating); pulsed laser deposition (in which a laser ablates material(s) from the deposition source(s) into vapor phase); sputter deposition (in which a glow plasma discharge—usually localized around the deposition source(s) by a magnet—bombards the material(s) of the source(s) sputtering some of the material(s) away as a vapor); and the like; or combinations thereof.

In an embodiment, a method 2000 of making a thin film optical element as disclosed herein excludes modifying the size of the thin film optical element 205. The substrate 210 can be sized to a target size and/or shape prior to depositing the thin film stack 230, 231 on the substrate 210. The size of the first deposition side 220 of the substrate 210 is not modified subsequent to the first thin film stack 230 being deposited on the first deposition side 220 of the substrate 210. Similarly, the size of the second deposition side 225 of the substrate 210 is not modified subsequent to the second thin film stack 231 being deposited on the second deposition side 225 of the substrate 210.

In an embodiment, the first deposition side 220 and/or the second deposition side 225 of the substrate 210 (e.g., the surface of the first deposition side 220 and/or the second deposition side 225) can be processed or prepared prior to depositing the thin film stack 230, 231 on the substrate 210. Preparing the first deposition side 220 and/or the second deposition side 225 of the substrate 210 may include reducing the thickness of the substrate 210 until a desired or predetermined thickness of the substrate 210 is achieved. In some embodiments, the thickness of the substrate 210 may be reduced through chemical means, such as etching, oxidation, etc. In other embodiments, the thickness of the substrate 210 may be reduced through physical means, such as cutting, cleaving, grinding, polishing, etc.

In some embodiments, the first deposition side 220 and/or the second deposition side 225 of the substrate 210 may include chemically treating the surface of the substrate 210 so that it becomes more amenable or receptive to a particular thin film deposition process. For example, some thin film deposition techniques can be surface selective. In other words, some of the materials used to build the layers of the thin film stack 230, 231 may not chemically bond or otherwise adhere to a given substrate 210 surface. To accommodate layer chemistries that may not directly adhere to a given substrate 210, the surface of the substrate 210 may be coated or otherwise pre-treated with a reactive agent, such as aluminum, titanium, silicon, germanium, indium, gallium, arsenic, etc. Coating the surface of the substrate 210 with a reactive agent may be done using any suitable sputtering techniques. The reactive agent may then be reacted in order to generate an oxide surface that may be more responsive to various thin film deposition techniques. In other embodiments, the surface of the substrate 210 may be treated with an oxidation product to promote adherence of thin layers.

In an embodiment, a method 2000 of making a thin film optical element as disclosed herein can comprise depositing 2500, with a deposition plume 250, 433, 435, a second thin film stack 231 on the second deposition side 225 of the substrate 210 to form the thin film optical element 205, wherein the thin film optical element 205 comprises the substrate 210, the first thin film stack 230 deposited on the first deposition side 220 of the substrate 210, and the second thin film stack 231 deposited on the second deposition side 225 of the substrate 210.

In some embodiments, the substrate 210 can be inverted 2300 (e.g., rotated, flipped, etc.) in the holder socket 150 subsequent to depositing the first thin film stack 230; wherein the holder opening 110 exposes the second deposition side 225 of the substrate 210 to the deposition plume 250, 433, 435; and wherein a portion of the second deposition side 225 of the substrate 210 contacts the substantially flat side 131 of the lip 130.

In embodiments where a mating holder 301 contacts the holder 100 and the substrate 210 and provides for securing the substrate 210 in place for thin film deposition as previously described herein, the substrate 210 secured in the holder 100 and the mating holder 301 can be inverted 2400 subsequent to depositing the first thin film stack 230, wherein the mating holder opening 310 exposes the second deposition side 225 of the substrate 210 to the deposition plume 250, 433, 435. As will be appreciated by one of skill in the art, and with the help of this disclosure, in such embodiments, inverting the substrate 210 secured in the holder 100 and the mating holder 301 entails inverting the whole assembly comprising the substrate 210, as well as the holder 100 and the mating holder 301 that secure the substrate 210 in place for thin film deposition.

In an embodiment, the thin film optical element 205 as disclosed herein can comprise the substrate 210 and the first thin film stack 230, wherein the first thin film stack 230 is deposited on the first deposition side 220 of the substrate 210; wherein the first thin film stack 230 comprises two or more film layers; wherein the first thin film stack 230 is characterized by a first uniform film thickness; and wherein the first uniform film thickness is defined as a thickness variation of less than about ±5%, alternatively less than about ±4%, alternatively less than about ±3%, alternatively less than about ±2%, alternatively less than about ±1%, alternatively less than about ±0.5%, or alternatively less than about ±0.1% in any 10 $mm^2$ of the first thin film stack 230, when compared to an average first thin film stack thickness across the entire first thin film stack 230. Film thickness and/or film thickness uniformity (e.g., first film thickness, second film thickness, first film thickness uniformity, second film thickness uniformity) can be determined by using any suitable methodology, such as ellipsometry, transmission spectroscopy, reflection spectroscopy, thin film profilometry, x-ray reflectivity, cross-sectional scanning electron microscopy, cross-sectional tunneling electron microscopy, and the like, or combinations thereof.

In an embodiment, the thin film optical element 205 as disclosed herein can further comprise a second thin film stack 231, wherein the second thin film stack 231 is deposited on the second deposition side 225 of the substrate 210; wherein the second thin film stack 231 comprises two or more film layers; wherein the second thin film stack 231 is characterized by a second uniform film thickness; wherein the second uniform film thickness is defined as a thickness variation of less than about ±5%, alternatively less than about ±4%, alternatively less than about ±3%, alternatively less than about ±2%, alternatively less than about ±1%, alternatively less than about ±0.5%, or alternatively less than about ±0.1% in any 10 $mm^2$ of the second thin film stack 231, when compared to an average second thin film stack thickness across the entire second thin film stack 231.

In an embodiment, each of the first thin film stack 230 and/or the second thin film stack 231 can be independently characterized by a thickness of from about 1 nm to about 10 μm, alternatively from about 50 nm to about 7.5 μm, or alternatively from about 100 nm to about 5 μm.

In an embodiment, each of the first thin film stack 230 and the second thin film stack 231 can independently comprise a plurality of layers (e.g., thin film layers). For example, each of the first thin film stack 230 and the second thin film stack 231 can independently comprise from about 2 to about 50 layers, alternatively from about 5 to about 35 layers, or alternatively from about 7 to about 25 layers.

In an embodiment, each layer of the first thin film stack 230 and/or the second thin film stack 231 can be independently characterized by a thickness of from about 0.5 nm to about 2 μm, alternatively from about 0.75 nm to about 1.5 μm, or alternatively from about 1 nm to about 1 μm. In some embodiments, all layers of the first thin film stack 230 and/or the second thin film stack 231 can have the same thickness. In other embodiments, some layers of the first thin film stack 230 and/or the second thin film stack 231 can have the same thickness, while other layers of the first thin film stack 230 and/or the second thin film stack 231 can have different thickness.

In an embodiment, each layer of the first thin film stack 230 and/or the second thin film stack 231 can independently comprise silicon (Si), niobium (Nb), germanium (Ge), binary oxides, quartz, silica ($SiO_2$), niobia ($Nb_2O_5$), germania ($GeO_2$), magnesium fluoride ($MgF_2$), titania ($TiO_2$), alumina ($Al_2O_3$), hafnium dioxide ($HfO_2$), ternary oxides, and the like, or combinations thereof.

In an embodiment, the initial or first layer deposited on the first deposition side 220 and/or the second deposition side 225 of the substrate 210 may be made of a metal oxide material, such as aluminum oxide ($Al_2O_3$), titanium dioxide ($TiO_2$), etc. As will be appreciated by one of skill in the art, and with the help of this disclosure, the oxide material of the first layer may prove advantageous in creating a good adhesion to the substrate 210, thereby protecting the thin films from inadvertent removal from the substrate 210. In some embodiments, one or both of the first and last layers of the first thin film stack 230 and/or the second thin film stack 231 may be deposited to a thickness that is greater than the other interposing layers (i.e., the layers disposed between the first deposited layer and the last deposited layer of a film stack; intermediate layers). As will be appreciated by one of skill in the art, and with the help of this disclosure, providing thicker first and/or last layers may provide increased mechanical strength to the thin film optical element 205.

In an embodiment, any two adjacent layers of the first thin film stack 230 and/or the second thin film stack 231 can be characterized by a different refraction index from each other. The thin film optical element 205 as disclosed herein can comprise a plurality of thin film layers consisting of various materials whose indices of refraction and size (e.g., thickness) may vary between each layer. The thin film layers may be deposited on the substrate so as to selectively pass predetermined fractions of electromagnetic radiation at different wavelengths configured to substantially mimic a regression vector corresponding to a particular physical or chemical property of interest of a substance of interest. In some embodiments, an individual thin film optical element 205 as disclosed herein can exhibit a specific transmission function that is tailored or weighted with respect to wavelength. As a result, an output light intensity from an integrated computational element (ICE) comprising the thin film optical element 205 conveyed to a detector may be related to a physical or chemical property of interest for the substance of interest.

As will be appreciated by one of skill in the art, and with the help of this disclosure, errors in fabrication of the constituent layers of a thin film optical element 205 can negatively impact the performance of the thin film optical element 205. In some instances, deviations of <0.1%, and even 0.01% or 0.0001% from complex indices of refraction, and/or thicknesses of the formed layers of the thin film optical element 205 can substantially impact the performance of the thin film optical element 205, in some cases to such an extent, that the thin film optical element 205 may become operationally useless. Further, and as will be appreciated by one of skill in the art, and with the help of this disclosure, depositing uniform thickness layers that lead to uniform thickness thin film stacks is important for the performance of thin film optical element 205 as disclosed herein.

In an embodiment, the beveled edge side 132 of the lip 130 and/or the beveled edge 140 can provide for the first uniform film thickness of the first thin film stack 230 and/or the second uniform film thickness of the second thin film stack 231. In an embodiment, the beveled edge side 332 of the lip 330 and/or the beveled edge 340 can provide for the second uniform film thickness of the second thin film stack 231. The steep angle 135, 335 (e.g., low angle with respect to the holder inner side 104 and/or mating holder inner side 304) provides for reducing or minimizing shadowing effects and/or edge effects of the holder 100 and/or mating holder 301 masking the deposition plume 250, 433, 435 near the edges of the holder opening 110 and/or mating holder opening 310. If the angle 135, 335 would be greater than 45°, for example a 90° angle, the deposition plume would hit the edge 140, 340 of the holder/mating holder much sooner, by providing a physical obstacle in the path of the deposition plume 250, 433, 435, which would lead to a shadowing effect and/or edge effect. Generally, edge effects refer to the non-uniform film deposition near the edges, e.g., non-uniform film deposition on the substrate 210 near the holder opening 110 and/or mating holder opening 310.

In an embodiment, the beveled edge 140 of the holder 100 and/or the beveled edge side 132 of the lip 130 of the holder 100 can be characterized by a geometry effective for minimizing edge effects of a given deposition plume spatial profile. The value of the angle 135 between (i) the substantially flat side 131 of the lip 130, the first deposition side 220 of the substrate 210, the second deposition side 225 of the substrate 210, or combinations thereof, and (ii) the beveled edge side 132 of the lip 130 and/or the beveled edge 140 of the holder 100 can be effective for minimizing edge effects of a given deposition plume spatial profile. For example, the angle 135 can be less than about 45°, alternatively less than about 40°, alternatively less than about 35°, alternatively less than about 30°, alternatively less than about 25°, alternatively less than about 20°, or alternatively less than about 15°.

In an embodiment, the beveled edge 340 of the mating holder 301 and/or the beveled edge side 332 of the lip 330 of the mating holder 301 can be characterized by a geometry effective for minimizing edge effects of a given deposition plume spatial profile. The value of the angle 335 between (i) the substantially flat side 331 of the lip 330 and/or the second deposition side 225 of the substrate 210, and (ii) the beveled edge side 332 of the lip 330 and/or the beveled edge 340 of the mating holder 301 can be effective for minimizing edge effects of a given deposition plume spatial profile. For example, the angle 335 can be less than about 45°, alternatively less than about 40°, alternatively less than about 35°, alternatively less than about 30°, alternatively less than about 25°, alternatively less than about 20°, or alternatively less than about 15°.

FIG. 4 illustrates the effects of various types of edges outlining the holder opening 110 in the system 400 for making a thin film optical element 205.

In the case of the deflecting terminal edge 440, the deposition plume 433 provides for a well-directed coating material, wherein the deflecting terminal edge 440 provides for a deflection path 434 that deflects excess material away from the first deposition side 220 of the substrate 210, thereby leading to a tuned edge 450 of the first thin film stack 230, as well as an uniform middle coating 460 of the first thin film stack 230.

In the case of the severely blunted edge 441, the deposition plume 435 provides for a coating material that is less well directed than the coating material near the deflecting terminal edge 440, wherein the severely blunted edge 441 provides for a deflection path 436 that deflects excess material towards the first deposition side 220 of the substrate 210, thereby leading to an increased edge deposition 470 which results in a non-uniform thin film. As will be appreciated by one of skill in the art, and with the help of this disclosure, increased edge deposition 470 is one example of an edge effect during thin film deposition.

The deposition plume 250, 433, 435 can be tuned (e.g., adjusted, modulated, etc.) in accordance with the geometry of the beveled edge bordering the holder opening 110 or the mating holder opening 310. For example, a spatial profile of the deposition plume 250, 433, 435 can be tuned in accordance with the geometry of the beveled edge 140 and/or the geometry of the beveled edge side 132 of the lip 130 to provide for minimizing edge effects during depositing the first thin film stack 230 and/or the second thin film stack 231. As another example, a spatial profile of the deposition plume 250, 433, 435 can be tuned in accordance with the geometry of the beveled edge 340 and/or the geometry of the beveled edge side 332 of the lip 330 to provide for minimizing edge effects during depositing the second thin film stack 231.

Without wishing to be limited by theory, a deposition plume 250, 433, 435 can be placed in a three-dimensional Cartesian coordinate system having axes x, y, and z. For example, the deposition plume 250, 433, 435 can display a spatial profile (i.e., a three-dimensional spatial profile) that has the same spatial symmetry relative to both x and y axes; e.g., the spatial profile of the deposition plume 250, 433, 435 can be a sphere (where the deposition plume can be provided by a point-like deposition source). As another example, when the deposition plume 250, 433, 435 is provided by an extended deposition source (as opposed to a point-like deposition source), the deposition plume 250, 433, 435 can display a Lambertian (cosine emission) spatial profile distribution. Other examples of spatial profiles of the deposition plume 250, 433, 435 can include a parabolic profile and/or a hyperbolic profile.

In some embodiments, the spatial profile of the deposition plume 250, 433, 435 can be tuned by focusing the deposition plume 250, 433, 435; by masking the deposition plume 250, 433, 435; or both by focusing the deposition plume 250, 433, 435 and by masking the deposition plume 250, 433, 435. In such embodiments, an electron beam (e.g., assisted ion beam) can contact a deposition source as previously described herein to produce the deposition plume 250, 433, 435; wherein the spatial profile of the deposition plume 250, 433, 435 can be tuned by focusing the electron beam, by masking the electron beam, or both by focusing the electron beam and by masking the electron beam.

In an embodiment, a method 2000 of making a thin film optical element as disclosed herein can comprise subjecting 2600 the thin film optical element 205 to quality control analysis, wherein the quality control analysis comprises at least one analytical technique selected from the group consisting of ellipsometry, reflectance spectroscopy, transmission spectroscopy, and combinations thereof. In embodiments where thin film stacks 230, 231 are deposited on both the first deposition side 220 and the second deposition side 225 of the substrate 210, the thin film optical element 205 may be subjected 2600 to quality control analysis subsequent to depositing the first thin film stack 230 and prior to depositing the second thin film stack 231, in order to assess the quality of the first thin film stack 230. In such embodiments, the thin film optical element 205 may be further subjected 2600 to quality control analysis subsequent to depositing the second thin film stack 231, in order to assess the quality of the second thin film stack 231. In such embodiments, the quality of the first thin film stack 230 may be reassessed subsequent to depositing the second thin film stack 231.

In some embodiments, the thin film optical element 205 may be subjected 2600 to quality control analysis subsequent to depositing both the first thin film stack 230 and the second thin film stack 231, in order to assess the quality of both the first thin film stack 230 and the quality of the second thin film stack 231.

In an embodiment, the quality control analysis comprises ellipsometry to assess film thickness and uniformity of the first thin film stack 230 and/or the second thin film stack 231.

In an embodiment, the quality control analysis comprises reflectance spectroscopy to assess a reflectance function of the thin film optical element 205.

In an embodiment, the quality control analysis comprises transmission spectroscopy to assess a transmission function of the thin film optical element 205.

In some embodiments, the thin film optical element 205 can be used as an integrated computational element (ICE). ICEs may enable the measurement of various chemical or physical characteristics of a substance through the use of regression techniques. For purposes of the disclosure herein, the terms "characteristic" or "characteristic of interest" refers to a chemical, mechanical, or physical property of a substance or a sample of the substance. The characteristic of a substance may include a quantitative or qualitative value of one or more chemical constituents or compounds present therein or any physical property associated therewith. Such chemical constituents and compounds may be referred to herein as "analytes." Nonlimiting examples of characteristics of a substance that can be analyzed with the help of the optical processing elements described herein (e.g., ICEs, such as thin film optical elements 205) can include, for example, chemical composition (e.g., identity and concentration in total or of individual components), phase presence (e.g., gas, oil, water, etc.), impurity content, pH, alkalinity, viscosity, density, ionic strength, total dissolved solids, salt content (e.g., salinity), porosity, opacity, bacteria content, total hardness, transmittance, state of matter (e.g., solid, liquid, gas, emulsion, mixtures thereof, etc.), and the like, or combinations thereof.

Further, for purposes of the disclosure herein, the term "substance" refers to at least a portion of matter or material of interest to be tested or otherwise evaluated with the help of the optical processing elements described herein (e.g., ICEs, such as thin film optical elements 205). The substance may be any fluid capable of flowing, including particulate solids, liquids, gases (e.g., air, nitrogen, carbon dioxide, argon, helium, methane, ethane, butane, and other hydrocarbon gases, hydrogen sulfide, or combinations thereof), slurries, emulsions, powders, muds, glasses, mixtures, combinations thereof, and may include, but is not limited to, aqueous fluids (e.g., water, brines, etc.), non-aqueous fluids (e.g., organic compounds, hydrocarbons, oil, a refined component of oil, petrochemical products, and the like), acids, surfactants, biocides, bleaches, corrosion inhibitors, foamers, foaming agents, breakers, scavengers, stabilizers, clarifiers, detergents, treatment fluids, fracturing fluids, formation fluids, or any oilfield fluid, chemical, or compound commonly found in the oil and gas industry. The substance may also refer to solid materials such as, but not limited to, rock formations, concrete, solid wellbore surfaces, pipes or flow lines, and solid surfaces of any wellbore tool or projectile (e.g., balls, darts, plugs, etc.).

Generally, information about a substance can be derived through the interaction of light with that substance (e.g., optical interaction); wherein such interaction can change characteristics of the light, for instance the frequency (and corresponding wavelength), intensity, polarization, and/or direction (e.g., through scattering, absorption, reflection or refraction). Chemical, thermal, physical, mechanical, optical or various other characteristics of the substance can be determined based on the changes in the characteristics of the light interacting with the substance. Thus, one or more characteristics of substances such as crude petroleum, gas, water, or other wellbore fluids can be assessed in-situ, e.g., downhole at well sites, as a result of the interaction between these substances and light. For purposes of the disclosure herein, the terms "optically interact" or "optical interaction" refer to the reflection, transmission, scattering, diffraction, or absorption of electromagnetic radiation either on, through, or from an optical processing element (e.g., ICE, such as a thin film optical element 205) or a substance being analyzed with the help of the optical processing element. Accordingly, optically interacted light refers to electromagnetic radiation that has been reflected, transmitted, scattered, diffracted, or absorbed by, emitted, or re-radiated, for example, using an optical processing element, but may also apply to optical interaction with a substance. Further, for purposes of the disclosure herein, the term "electromagnetic radiation" refers to radio waves, microwave radiation, terahertz radiation, infrared and near-infrared radiation, visible light, ultraviolet light, X-ray radiation, gamma ray radiation, and the like.

An ICE can selectively weight (when operated as part of an optical analysis tool) light modified by a sample in at least a portion of a wavelength range such that the weightings can be correlated to one or more characteristics of the sample. An ICE can be an optical substrate with multiple stacked dielectric layers (e.g., from about 2 to about 50 layers), each having a different complex refractive index from its adjacent layers, for example the thin film optical element 205 as disclosed herein. As will be appreciated by one of skill in the art, and with the help of this disclosure, the specific number of layers in the thin film optical element 205, the optical properties of the layers, the optical properties of the substrate, the thickness of each layer, etc. can be selected so that the light processed by the ICE is related to one or more characteristics of the sample. Further, and as will be appreciated by one of skill in the art, and with the help of this disclosure, because ICEs extract information from the light modified by a sample passively, ICEs can be incorporated in low cost and rugged optical analysis tools. Hence, ICE-based downhole optical analysis tools can provide a relatively low cost, rugged and accurate system for monitoring quality of wellbore fluids, for example.

In an embodiment, the ICE can be further employed 2700 in an optical computing device. Optical computing devices, also commonly referred to as optic analytical devices, can be used to analyze and monitor a sample or substance in real time. For purposes of the disclosure herein, the term "optical computing device" refers to an optical device that is configured to receive an input of electromagnetic radiation associated with a substance and produce an output of electromagnetic radiation from an optical processing element (e.g., ICE, such as the thin film optical element 205) arranged within or otherwise associated with the optical computing device. The electromagnetic radiation that optically interacts with the optical processing element is changed so as to be readable by a detector, such that an output of the detector can be correlated to a particular characteristic of the substance being analyzed. The output of electromagnetic radiation from the optical processing element can be reflected, transmitted, and/or dispersed electromagnetic radiation. Whether the detector analyzes reflected, transmitted, or dispersed electromagnetic radiation may be dictated by structural parameters of the optical computing device as well as other considerations known to one of skill in the art.

In some embodiments, the optical computing device can be employed 2700 in a downhole tool in a wellbore penetrating a subterranean formation. For example, the downhole tool can be a well logging tool, wherein the well logging tool can be configured as an ICE-based optical analysis tool. As another example, the downhole tool can be a bottom hole assembly, a drilling assembly, a sampling tool of a wireline application, and a measurement device associated with production tubing, and the like, or combinations thereof.

In an embodiment, a system for making thin film optical elements and methods of using same as disclosed herein may display advantages when compared with conventional systems for making thin film optical elements and methods of using same. Conventionally, thin film optical elements are fabricated on large substrates which are subsequently cored or sized into thin film optical elements of desired sizes. However, fabricating a small number of customized thin film optical elements entails unique challenges, such as difficulty associated with securing substrates with respect to the deposition plume, individualized quality control etc.

In an embodiment, a system for making thin film optical elements and methods of using same as disclosed herein can advantageously provide for depositing substantially uniform thin film stacks on substrates of desired shape and size, without the need to further size the obtained thin film optical elements. Additional advantages of the systems for making thin film optical elements and methods of using same as disclosed herein may be apparent to one of skill in the art viewing this disclosure.

Additional Disclosure

A first embodiment, which is a system for making a thin film optical element (205) comprising (i) a thin film optical element (205) comprising a substrate (210) and a first thin film stack (230), wherein the first thin film stack (230) is deposited on a first deposition side (220) of the substrate (210); wherein the first thin film stack (230) comprises two or more film layers; wherein the first thin film stack (230) is characterized by a first uniform film thickness; and wherein the first uniform film thickness is defined as a thickness variation of less than about ±5% in any 10 $mm^2$ of the first thin film stack (230), when compared to an average first thin film stack thickness across the entire first thin film stack (230), (ii) a holder (100) comprising at least one holder opening (110); wherein the holder (100) has a holder outer side (102) and a holder inner side (104); wherein the holder outer side (102) has at least one beveled edge (140) extending into a lip (130); wherein the beveled edge (140) and the lip (130) define the at least one holder opening (110); wherein the lip (130) has a substantially flat side (131) and a beveled edge side (132); wherein the beveled edge (140) and/or the beveled edge side (132) of the lip (130) form an angle (135) of less than about 45° with the substantially flat side (131) of the lip (130) and/or the first deposition side (220); wherein the substantially flat side (131) of the lip (130) and the holder inner side (104) define a holder socket (150); wherein the holder (100) is configured to receive the substrate (210) in the holder socket (150); wherein the holder opening (110) is configured to expose the first deposition side (220) of the substrate (210) to a deposition plume (250, 433, 435); wherein a portion of the first deposition side (220) of the substrate (210) contacts the substantially flat side (131) of the lip (130), thereby allowing for the first thin film stack (230) to be deposited on the first deposition side (220) of the substrate (210); and wherein the beveled edge side (132) of the lip (130) and/or the beveled edge (140) provide for the first uniform film thickness of the first thin film stack (230), and (iii) a deposition source configured to provide the deposition plume (250, 433, 435) for depositing the first thin film stack (230) on the first deposition side (220) of the substrate (210); wherein the deposition plume (250, 433, 435) travels towards the first deposition side (220) of the substrate (210) at a direction substantially perpendicular to the substantially flat side (131) of the lip (130) and/or to the first deposition side (220) of the substrate (210); and wherein the beveled edge side (132) of the lip (130) faces the deposition plume (250, 433, 435).

A second embodiment, which is the system of the first embodiment, wherein a value of the angle (135) between (a) the substantially flat side (131) of the lip (130) and/or the first deposition side (220) of the substrate (210), and (b) the beveled edge side (132) of the lip (130) and/or the beveled edge (140) is effective for minimizing edge effects of a given deposition plume spatial profile.

A third embodiment, which is the system of any one of the first and the second embodiments, wherein the thin film optical element (205) is characterized by a size of the first deposition side (220) of the substrate (210) of less than about 0.5 inches (12.7 mm).

A fourth embodiment, which is the system of any one of the first through the third embodiments, wherein the thin film optical element (205) is characterized by a size of the first deposition side (220) of the substrate (210) of less than about 0.25 inches (6.4 mm).

A fifth embodiment, which is the system of the third embodiment, wherein the size of the first deposition side (220) of the substrate (210) is not modified subsequent to the first thin film stack (230) being deposited on the first deposition side (220) of the substrate (210).

A sixth embodiment, which is the system of any one of the first through the fifth embodiments, wherein the lip (130) is characterized by a terminal edge (136) that further defines the holder opening (110).

A seventh embodiment, which is the system of the sixth embodiment, wherein the terminal edge (136) is a sharp terminal edge (145).

An eighth embodiment, which is the system of the sixth embodiment, wherein the terminal edge (136) is a blunted terminal edge (240).

A ninth embodiment, which is the system of the sixth embodiment, wherein the terminal edge (136) is a deflecting terminal edge (440).

A tenth embodiment, which is the system of any one of the first through the ninth embodiments, wherein the holder opening (110), the first deposition side (220) of the substrate (210), or both the holder opening (110) and the first deposition side (220) of the substrate (210) are circular (510).

An eleventh embodiment, which is the system of any one of the first through the ninth embodiments, wherein the holder opening (110), the first deposition side (220) of the substrate (210), or both the holder opening (110) and the first deposition side (220) of the substrate (210) are elliptical (520).

A twelfth embodiment, which is the system of any one of the first through the ninth embodiments, wherein the holder opening (110), the first deposition side (220) of the substrate (210), or both the holder opening (110) and the first deposition side (220) of the substrate (210) are characterized by irregular geometry (530).

A thirteenth embodiment, which is the system of any one of the first through the twelfth embodiments, wherein the substrate (210) has a second deposition side (225) spatially opposed to the first deposition side (220); wherein the thin film optical element (205) further comprises a second thin film stack (231), wherein the second thin film stack (231) is deposited on the second deposition side (225) of the substrate (210); wherein the second thin film stack (231) comprises two or more film layers; wherein the second thin film stack (231) is characterized by a second uniform film thickness; wherein the second uniform film thickness is defined as a thickness variation of less than about ±5% in any 10 $mm^2$ of the second thin film stack (231), when compared to an average second thin film stack thickness across the entire second thin film stack (231).

A fourteenth embodiment, which is the system of the thirteenth embodiment further comprising a mating holder (301); wherein the mating holder (301) contacts the holder (100) and the substrate (210); and wherein the mating holder (301) provides for securing the substrate (210) in place for the deposition of the first thin film stack (230) on the first deposition side (220) of the substrate (210), the deposition of the second thin film stack (231) on the second deposition side (225) of the substrate (210), or both the deposition of the first thin film stack (230) on the first deposition side (220) of the substrate (210) and the deposition of the second thin film stack (231) on the second deposition side (225) of the substrate (210).

A fifteenth embodiment, which is the system of the fourteenth embodiment, wherein the mating holder (301) comprises at least one mating holder opening (310); wherein the mating holder (301) has a mating holder outer side (302) and a mating holder inner side (304); wherein the mating holder inner side (304) contacts the holder inner side (104); wherein the mating holder outer side (302) has at least one beveled edge (340) extending into a lip (330); wherein the beveled edge (340) and the lip (330) of the mating holder (301) define the at least one mating holder opening (310); wherein the lip (330) of the mating holder (301) has a substantially flat side (331) and a beveled edge side (332); wherein the beveled edge (340) and/or the beveled edge side (332) of the lip (330) of the mating holder (301) form an angle (335) of less than about 45° with the substantially flat side (331) of the lip (330) of the mating holder (301) and/or the second deposition side (225); wherein the substantially flat side (331) of the lip (330) of the mating holder (301) and the mating holder inner side (304) define a mating holder socket (350); wherein the mating holder (301) is configured to receive the substrate (210) in the mating holder socket (350); wherein the mating holder opening (310) is configured to expose the second deposition side (225) of the substrate (210) to a deposition plume (250, 433, 435); wherein a portion of the second deposition side (225) of the substrate (210) contacts the substantially flat side (331) of the lip (330) of the mating holder (301), thereby allowing for the second thin film stack (231) to be deposited on the second deposition side (225) of the substrate (210); wherein the beveled edge side (332) of the lip (330) and/or the beveled edge (340) of the mating holder (301) provide for the second uniform film thickness of the second thin film stack (231); wherein the holder opening (110) and the mating holder opening (310) are the same or different; and wherein the beveled edge side (332) of the lip (330) of the mating holder (301) is the same or different as the beveled edge side (132) of the lip (130) of the holder (100).

A sixteenth embodiment, which is the system of the fifteenth embodiment, wherein the holder (100) and the mating holder (301) are configured to spatially rotate the secured substrate (210) to provide for the deposition plume (250, 433, 435) traveling towards the second deposition side (225) of the substrate (210) at a direction substantially perpendicular to the substantially flat side (331) of the lip (330) of the mating holder (301) and/or to the second deposition side (225) of the substrate (210); and wherein the beveled edge side (332) of the lip (330) of the mating holder (301) faces the deposition plume (250, 433, 435).

A seventeenth embodiment, which is the system of the sixteenth embodiment, wherein the beveled edge (340) of the mating holder (301) and/or the beveled edge side (332) of the lip (330) of the mating holder (301) are characterized by a geometry effective for minimizing edge effects of a given deposition plume spatial profile.

An eighteenth embodiment, which is the system of any one of the thirteenth through the seventeenth embodiments, wherein the thin film optical element (205) is characterized by a size of the second deposition side (225) of the substrate (210) of less than about 0.5 inches (12.7 mm).

A nineteenth embodiment, which is the system of any one of the thirteenth through the eighteenth embodiments, wherein the thin film optical element (205) is characterized by a size of the second deposition side (225) of the substrate (210) of less than about 0.25 inches (6.4 mm).

A twentieth embodiment, which is the system of any one of the thirteenth through the nineteenth embodiments, wherein the first deposition side (220) and the second deposition side (225) of the substrate (210) are substantially parallel to each other.

A twenty-first embodiment, which is the system of any one of the thirteenth through the twentieth embodiments, wherein the first deposition side (220) and the second deposition side (225) of the substrate (210) are not parallel to each other.

A twenty-second embodiment, which is the system of any one of the thirteenth through the twenty-first embodiments, wherein a distance between the first deposition side (220) and the second deposition side (225) of the substrate (210) is less than the size of the first deposition side (220) and/or the size of the second deposition side (225).

A twenty-third embodiment, which is the system of any one of the thirteenth through the twenty-first embodiments, wherein a distance between the first deposition side (220) and the second deposition side (225) of the substrate (210) is equal to or greater than the size of the first deposition side (220) and/or the size of the second deposition side (225).

A twenty-fourth embodiment, which is the system of any one of the thirteenth through the twenty-third embodiments, wherein each of the first thin film stack (230) and the second thin film stack (231) independently comprise from about 2 to about 50 layers.

A twenty-fifth embodiment, which is the system of any one of the thirteenth through the twenty-fourth embodiments, wherein each of the first thin film stack (230) and the second thin film stack (231) independently comprise from about 7 to about 25 layers.

A twenty-sixth embodiment, which is the system of any one of the thirteenth through the twenty-fifth embodiments, wherein each layer of the first thin film stack (230) and/or the second thin film stack (231) is independently characterized by a thickness of from about 0.5 nm to about 2 μm.

A twenty-seventh embodiment, which is the system of any one of the thirteenth through the twenty-sixth embodiments, wherein each of the first thin film stack (230) and/or the second thin film stack (231) is independently characterized by a thickness of from about 1 nm to about 10 μm.

A twenty-eighth embodiment, which is the system of any one of the first through the twenty-seventh embodiments, wherein the substrate (210) comprises an optically transparent material, glass, optically transparent glass, silica, sapphire, silicon, germanium, zinc selenide, zinc sulfide, polycarbonate, polymethylmethacrylate (PMMA), polyvinylchloride (PVC), diamond, ceramics, or combinations thereof.

A twenty-ninth embodiment, which is the system of any one of the thirteenth through the twenty-eighth embodiments, wherein each layer of the first thin film stack (230) and/or the second thin film stack (231) independently comprises silicon (Si), niobium (Nb), germanium (Ge), binary oxides, quartz, silica ($SiO_2$), niobia ($Nb_2O_5$), germania ($GeO_2$), magnesium fluoride ($MgF_2$), titania ($TiO_2$), alumina ($Al_2O_3$), hafnium dioxide ($HfO_2$), ternary oxides, or combinations thereof.

A thirtieth embodiment, which is the system of any one of the thirteenth through the twenty-ninth embodiments, wherein any two adjacent layers of the first thin film stack (230) and/or the second thin film stack (231) are characterized by a different refraction index from each other.

A thirty-first embodiment, which is the system of any one of the first through the thirtieth embodiments, wherein the holder (100) comprises a plurality of holder openings (110); wherein the plurality of holder openings (110) provides for the deposition of a thin film stack on a plurality of substrates (210); and wherein each holder opening (110) is configured to allow for the deposition of a thin film stack on an individual substrate (210).

A thirty-second embodiment, which is a method (2000) for making a thin film optical element (205) comprising (a) placing (2100) a substrate (210) in a holder socket (150) of a holder (100); wherein the substrate (210) has a first deposition side (220); wherein the holder (100) comprises at least one holder opening (110); wherein the holder (100) has a holder outer side (102) and a holder inner side (104); wherein the holder outer side (102) has at least one beveled edge (140) extending into a lip (130); wherein the beveled edge (140) and the lip (130) define the at least one holder opening (110); wherein the lip (130) has a substantially flat side (131) and a beveled edge side (132); wherein the beveled edge (140) and/or the beveled edge side (132) of the lip (130) form an angle (135) of less than about 45° with the substantially flat side (131) of the lip (130) and/or the first deposition side (220); wherein the substantially flat side (131) of the lip (130) and the holder inner side (104) define the holder socket (150), and (b) depositing (2200), with a deposition plume (250, 433, 435), a first thin film stack (230) on a first deposition side (220) of the substrate (210) to form a thin film optical element (205), wherein the thin film optical element (205) comprises the substrate (210) and the first thin film stack (230) deposited on the first deposition side (220) of the substrate (210), wherein the first thin film stack (230) comprises two or more film layers; wherein the first thin film stack (230) is characterized by a first uniform film thickness; and wherein the first uniform film thickness is defined as a thickness variation of less than about ±5% in any 10 $mm^2$ of the first thin film stack (230), when compared to an average first thin film stack thickness across the entire first thin film stack (230), wherein a portion of the first deposition side (220) of the substrate (210) contacts the substantially flat side (131) of the lip (130); wherein the holder opening (110) exposes the first deposition side (220) of the substrate (210) to the deposition plume (250, 433, 435); wherein the beveled edge side (132) of the lip (130) and/or the beveled edge (140) provide for the first uniform film thickness of the first thin film stack (230), wherein the deposition plume (250, 433, 435) travels towards the first deposition side (220) of the substrate (210) at a direction substantially perpendicular to the substantially flat side (131) of the lip (130) and/or to the first deposition side (220); and wherein the beveled edge side (132) of the lip (130) faces the deposition plume (250, 433, 435).

A thirty-third embodiment, which is the method (2000) of the thirty-second embodiment further excluding modifying the size of the thin film optical element (205).

A thirty-fourth embodiment, which is the method (2000) of any one of the thirty-second and the thirty-third embodiments, wherein the substrate (210) is sized to a target size prior to depositing the first thin film stack (230).

A thirty-fifth embodiment, which is the method (2000) of any one of the thirty-second through the thirty-fourth embodiments, wherein a deposition plume spatial profile is tuned in accordance with the geometry of the beveled edge (140) and/or the geometry of the beveled edge side (132) of the lip (130) to provide for minimizing edge effects during depositing the first thin film stack (230).

A thirty-sixth embodiment, which is the method (2000) of the thirty-fifth embodiment, wherein the deposition plume spatial profile is tuned by focusing the deposition plume (250, 433, 435); by masking the deposition plume (250, 433, 435); or both by focusing the deposition plume (250, 433, 435) and by masking the deposition plume (250, 433, 435).

A thirty-seventh embodiment, which is the method (2000) of the thirty-sixth embodiment, wherein an electron beam contacts a deposition source to produce the deposition plume (250, 433, 435), and wherein the deposition plume spatial profile is tuned by focusing the electron beam, by masking the electron beam, or both by focusing the electron beam and by masking the electron beam.

A thirty-eighth embodiment, which is the method (2000) of the thirty-seventh embodiment, wherein the electron beam is an assisted ion beam.

A thirty-ninth embodiment, which is the method (2000) of any one of the thirty-second through the thirty-eighth embodiments, wherein the substrate (210) has a second deposition side (225) spatially opposed to the first deposition side (220).

A fortieth embodiment, which is the method (2000) of the thirty-ninth embodiment further comprising inverting (2300) the substrate (210) in the holder socket (150) subsequent to depositing the first thin film stack (230); wherein the holder opening (110) exposes the second deposition side (225) of the substrate (210) to the deposition plume (250, 433, 435); and wherein a portion of the second deposition side (225) of the substrate (210) contacts the substantially flat side (131) of the lip (130).

A forty-first embodiment, which is the method (2000) of the fortieth embodiment further comprising depositing (2500), with the deposition plume (250, 433, 435), a second thin film stack (231) on the second deposition side (225) of the substrate (210); wherein the thin film optical element (205) further comprises the second thin film stack (231) deposited on the second deposition side (225) of the substrate (210).

A forty-second embodiment, which is the method (2000) of any one of the thirty-ninth through the forty-first embodiments, wherein a mating holder (301) contacts the holder (100) and the substrate (210), and wherein the mating holder (301) provides for securing the substrate (210) in place for depositing a thin film stack (230, 231) on the substrate (210).

A forty-third embodiment, which is the method (2000) of the forty-second embodiment, wherein the mating holder (301) comprises at least one mating holder opening (310); wherein the mating holder (301) has a mating holder outer side (302) and a mating holder inner side (304); wherein the mating holder inner side (304) contacts the holder inner side (104); wherein the mating holder outer side (302) has at least one beveled edge (340) extending into a lip (330); wherein the beveled edge (340) and the lip (330) of the mating holder (301) define the at least one mating holder opening (310); wherein the lip (330) of the mating holder (301) has a substantially flat side (331) and a beveled edge side (332); wherein the beveled edge (340) and/or the beveled edge side (332) of the lip (330) of the mating holder (301) form an angle (335) of less than about 45° with the substantially flat side (331) of the lip (330) of the mating holder (301) and/or the second deposition side (225); wherein the substantially flat side (331) of the lip (330) of the mating holder (301) and the mating holder inner side (304) define a mating holder socket (350); wherein the mating holder (301) receives the substrate (210) in the mating holder socket (350); wherein a portion of the second deposition side (225) of the substrate (210) contacts the substantially flat side (331) of the lip (330) of the mating holder (301); wherein the holder opening (110) and the mating holder opening (310) are the same or different; and wherein the beveled edge side (332) of the lip (330) of the mating holder (301) is the same or different as the beveled edge side (132) of the lip (130) of the holder (100).

A forty-fourth embodiment, which is the method (2000) of the forty-third embodiment further comprising (i) inverting (2400) the substrate (210) secured in the holder (100) and the mating holder (301) subsequent to depositing the first thin film stack (230); and (ii) depositing (2500), with the deposition plume (250, 433, 435), a second thin film stack (231) on the second deposition side (225) of the substrate (210), wherein the thin film optical element (205) further comprises the second thin film stack (231) deposited on the second deposition side (225) of the substrate (210), wherein the second thin film stack (231) comprises two or more film layers; wherein the second thin film stack (231) is characterized by a second uniform film thickness; wherein the second uniform film thickness is defined as a thickness variation of less than about +5% in any 10 $mm^2$ of the second thin film stack (231), when compared to an average second thin film stack thickness across the entire second thin film stack (231), wherein the mating holder opening (310) exposes the second deposition side (225) of the substrate (210) to the deposition plume (250, 433, 435); wherein the beveled edge of the lip of the mating holder opening (310) faces the deposition plume (250, 433, 435); and wherein the beveled edge side (332) of the lip (330) and/or the beveled edge (340) of the mating holder (301) provide for the second uniform film thickness of the second thin film stack (231).

A forty-fifth embodiment, which is the method (2000) of the forty-fourth embodiment, wherein the thin film optical element (205) is subjected (2600) to quality control analysis, wherein the quality control analysis comprises at least one analytical technique selected from the group consisting of ellipsometry, reflectance spectroscopy, transmission spectroscopy, and combinations thereof.

A forty-sixth embodiment, which is the method (2000) of the forty-fifth embodiment, wherein the quality control analysis comprises ellipsometry to assess film thickness and uniformity of the first thin film stack (230) and/or the second thin film stack (231).

A forty-seventh embodiment, which is the method (2000) of any one of the forty-fifth and the forty-sixth embodiments, wherein the quality control analysis comprises reflectance spectroscopy to assess a reflectance function of the thin film optical element (205).

A forty-eighth embodiment, which is the method (2000) of any one of the forty-fifth through the forty-seventh embodiments, wherein the quality control analysis comprises transmission spectroscopy to assess a transmission function of the thin film optical element (205).

A forty-ninth embodiment, which is the method (2000) of any one of the forty-fifth through the forty-eighth embodiments, wherein the first thin film stack (230) is subjected (2600) to quality control analysis prior to and/or subsequent to depositing the second thin film stack (231).

A fiftieth embodiment, which is the method (2000) of any one of the forth-fifth through the forty-ninth embodiments, wherein the first thin film stack (230) and/or the second thin film stack (231) are subjected (2600) to quality control analysis.

A fifty-first embodiment, which is the method (2000) of any one of the thirty-second through the fiftieth embodiments, wherein the thin film optical element (205) is an integrated computational element (ICE), and wherein the ICE is further employed (2700) in an optical computing device.

A fifty-second embodiment, which is the method (2000) of the fifty-first embodiment, wherein the optical computing device is employed (2700) in a downhole tool in a wellbore penetrating a subterranean formation.

A fifty-third embodiment, which is a holder system for making a thin film optical element comprising (i) a holder outer side (102) comprising at least one beveled edge (140) extending into a lip (130) comprising a substantially flat side (131) and a beveled edge side (132), wherein the beveled edge (140) and/or the beveled edge side (132) of the lip (130) form an angle of less than about 45° with the substantially flat side (131) of the lip (130); (ii) at least one holder opening (110) defined by the beveled edge (140) and the lip (130); (iii) a holder inner side (104); and (iv) a holder socket (150) defined by the substantially flat side (131) of the lip (130) and the holder inner side (104), wherein the holder (100) is configured to receive a substrate (210) in the holder socket (150); and wherein the holder opening (110) is configured to expose a first deposition side (220) of the substrate (210) to a deposition plume (250, 433, 435).

While embodiments of the invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_L$, and an upper limit, $R_U$, is disclosed, any number falling within the range is specifically disclosed. In particular, the following numbers within the range are specifically disclosed: $R=R_L+k*(R_U-R_L)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. When a feature is described as "optional," both embodiments with this feature and embodiments without this feature are disclosed. Similarly, the present disclosure contemplates embodiments where this feature is required and embodiments where this feature is specifically excluded. Both alternatives are intended to be within the scope of the claim. Use of broader terms such as comprises, includes, having, etc. should be understood to provide support for narrower terms such as consisting of, consisting essentially of, comprised substantially of, etc.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the embodiments of the present invention. The discussion of a reference in the Description of Related Art is not an admission that it is prior art to the present invention, especially any reference that may have a publication date after the priority date of this application. The disclosures of all patents, patent applications, and publications cited herein are hereby incorporated by reference, to the extent that they provide exemplary, procedural or other details supplementary to those set forth herein.

What is claimed is:

1. A method for making a thin film optical element comprising:

placing a substrate in a holder socket of a holder,
wherein the substrate is disk-shaped,
wherein the substrate has a first deposition side,
wherein the holder comprises at least one holder opening,
wherein the holder has a holder outer side and a holder inner side,
wherein the holder outer side has at least one beveled edge extending into a lip,
wherein the beveled edge and the lip define the at least one holder opening,
wherein the lip has a substantially flat side and a beveled edge side,
wherein a locating hole through the lip of the holder from the beveled edge side to the substantially flat side marks a margin of the substrate,
wherein the beveled edge and/or the beveled edge side of the lip form an angle of less than about 45° with the substantially flat side of the lip and/or the first deposition side, and
wherein the substantially flat side of the lip and the holder inner side define the holder socket;

depositing, with a deposition plume, a first thin film stack on the first deposition side of the substrate to form a thin film optical element,
wherein the first thin film stack comprises two or more film layers,
wherein the first thin film stack is characterized by a first uniform film thickness,
wherein the first uniform film thickness is defined as a thickness variation of less than about ±5% in any 10 $mm^2$ of the first thin film stack, when compared to an average first thin film stack thickness across the entire first thin film stack,
wherein a portion of the first deposition side of the substrate contacts the substantially flat side of the lip,
wherein the holder opening exposes the first deposition side of the substrate to the deposition plume,
wherein the beveled edge side of the lip and/or the beveled edge provide for the first uniform film thickness of the first thin film stack,
wherein the deposition plume travels towards the first deposition side of the substrate at a direction substantially perpendicular to the substantially flat side of the lip and/or to the first deposition side,
wherein the beveled edge side of the lip faces the deposition plume,
wherein a mating holder secures the substrate and comprises a mating holder inner side,
wherein the mating holder inner side contacts the holder inner side at a virtual plane passing through the substrate,
wherein the substrate has a second deposition side spatially opposed to the first deposition side;

inverting the substrate and the holder socket subsequent to the depositing of the first thin film stack such that the second deposition side of the substrate is exposed to the deposition plume; and depositing, with the deposition plume, a second thin film stack on the second deposition side of the substrate.

2. The method of claim 1 further excluding modifying the size of the thin film optical element; wherein the substrate is sized to a target size prior to depositing the first thin film stack.

3. The method of claim 1, wherein a deposition plume spatial profile is tuned in accordance with the geometry of the beveled edge and/or the geometry of the beveled edge side of the lip to provide for minimizing edge effects during depositing the first thin film stack.

4. The method of claim 3, wherein the deposition plume spatial profile is tuned by focusing the deposition plume; by masking the deposition plume; or both by focusing the deposition plume and by masking the deposition plume.

5. The method of claim 1, wherein the mating holder further comprises at least one mating holder opening; wherein the mating holder has a mating holder outer side; wherein the mating holder outer side has at least one beveled edge extending into the lip; wherein the beveled edge and the lip of the mating holder define the at least one mating holder opening; wherein the lip of the mating holder has a substantially flat side and a beveled edge side; wherein the beveled edge and/or the beveled edge side of the lip of the mating holder form an angle of less than about 45° with the substantially flat side of the lip of the mating holder and/or the second deposition side; wherein the substantially flat side of the lip of the mating holder and the mating holder inner side define a mating holder socket; wherein the mating holder receives the substrate in the mating holder socket; and wherein a portion of the second deposition side of the substrate contacts the substantially flat side of the lip of the mating holder.

6. The method of claim 5, further comprising inverting the substrate secured in the holder and the mating holder subsequent to depositing the first thin film stack.

7. The method of claim 6, wherein inverting the substrate secured in the holder and the mating holder comprises inverting the holder and the mating holder while the substrate is secured in the holder and the mating holder.

8. The method of claim 7, wherein the thin film optical element is subjected to quality control analysis, wherein the quality control analysis comprises at least one analytical technique selected from the group consisting of ellipsometry, reflectance spectroscopy, transmission spectroscopy, and combinations thereof.

9. The method of claim 6, further comprising depositing, with the deposition plume, the second thin film stack on the second deposition side of the substrate, wherein the thin film optical element further comprises the second thin film stack deposited on the second deposition side of the substrate;

wherein the second thin film stack comprises two or more film layers; wherein the second thin film stack is characterized by a second uniform film thickness; wherein the second uniform film thickness is defined as a thickness variation of less than about ±5% in any 10 $mm^2$ of the second thin film stack, when compared to an average second thin film stack thickness across the entire second thin film stack;

wherein the mating holder opening exposes the second deposition side of the substrate to the deposition plume; wherein the beveled edge of the lip of the mating holder faces the deposition plume; and wherein the beveled edge side of the lip and/or the beveled edge of the mating holder provide for the second uniform film thickness of the second thin film stack.

10. The method of claim 5, wherein the holder opening and the mating holder opening are the same.

11. The method of claim 5, wherein the holder opening and the mating holder opening are different.

12. The method of claim 5, wherein the beveled edge side of the lip of the mating holder is the same as the beveled edge side of the lip of the holder.

13. The method of claim 5, wherein the beveled edge side of the lip of the mating holder is different from the beveled edge side of the lip of the holder.

14. The method of claim 5, wherein the lip of the mating holder is characterized by a terminal edge that further defines the holder opening, wherein the terminal edge is a deflecting terminal edge.

15. The method of claim 1, wherein the thin film optical element is an integrated computational element (ICE); wherein the ICE is employed in an optical computing device; and wherein the optical computing device is further employed in a downhole tool in a wellbore penetrating a subterranean formation.

16. The method of claim 1, wherein the lip is characterized by a terminal edge that further defines the holder opening, wherein the terminal edge is a deflecting terminal edge.

17. The method of claim 1, wherein the substrate comprises an optically transparent material, glass, optically transparent glass, silica, sapphire, silicon, germanium, zinc selenide, zinc sulfide, polycarbonate, polymethylmethacrylate (PMMA), polyvinylchloride (PVC), diamond, ceramics, or combinations thereof.

18. The method of claim 1, wherein each layer of the first thin film stack comprises silicon (Si), niobium (Nb), germanium (Ge), binary oxides, quartz, silica ($SiO_2$), niobia ($Nb_2O_5$), germania ($GeO_2$), magnesium fluoride ($MgF_2$), titania ($TiO_2$), alumina ($Al_2O_3$), hafnium dioxide ($HfO_2$), ternary oxides, or combinations thereof.

19. The method of claim 1, wherein a cross section of the mating holder is a reflection of a cross section of the holder over the virtual plane.

20. The method of claim 1, wherein the lip faces a same direction as the holder inner side.

* * * * *